(12) United States Patent
Rathei et al.

(10) Patent No.: US 6,963,813 B1
(45) Date of Patent: Nov. 8, 2005

(54) METHOD AND APPARATUS FOR FAST AUTOMATED FAILURE CLASSIFICATION FOR SEMICONDUCTOR WAFERS

(76) Inventors: Dieter Rathei, 1, Rue Trousseau, F-75011 Paris (FR); Peter Oswald, 2520B Lakefield Mews Ct., Richmond, VA (US) 23231; Thomas Hladschik, 11805 Park Forest Way, Glen Allen, VA (US) 23060; Joerg Wohlfahrt, 6032 Waybrook Way, Glen Allen, VA (US) 23060

( * ) Notice: Subject to any disclaimer, the term of this patent is extended or adjusted under 35 U.S.C. 154(b) by 0 days.

(21) Appl. No.: 09/660,703

(22) Filed: Sep. 13, 2000

(51) Int. Cl.[7] .......................... G01N 37/00; G06F 19/00
(52) U.S. Cl. ...................................................... 702/82
(58) Field of Search .............................. 702/82, 81, 84, 702/33, 35, 117, 118; 438/17, 14; 706/20; 714/799; 700/110, 121

(56) References Cited

U.S. PATENT DOCUMENTS

| | | | | |
|---|---|---|---|---|
| 5,240,866 A | * | 8/1993 | Friedman et al. | 702/35 |
| 5,256,578 A | * | 10/1993 | Corley et al. | 438/17 |
| 5,777,901 A | * | 7/1998 | Berezin et al. | 716/19 |
| 5,831,865 A | * | 11/1998 | Berezin et al. | 716/7 |
| 5,896,294 A | * | 4/1999 | Chow et al. | 700/121 |
| 5,937,367 A | | 8/1999 | Eckardt | 702/117 |
| 5,946,214 A | * | 8/1999 | Heavlin et al. | 700/121 |
| 5,950,181 A | | 9/1999 | Federl | 706/15 |
| 5,991,699 A | * | 11/1999 | Kulkarni et al. | 702/83 |
| 6,009,536 A | * | 12/1999 | Rohwer | 714/8 |
| 6,009,545 A | * | 12/1999 | Tsutsui et al. | 714/718 |
| 6,185,324 B1 | * | 2/2001 | Ishihara et al. | 382/149 |
| 6,185,511 B1 | * | 2/2001 | Steffan et al. | 702/81 |
| 6,208,947 B1 | * | 3/2001 | Beffa | 702/118 |
| 6,223,098 B1 | * | 4/2001 | Cheong et al. | 700/223 |
| 6,233,719 B1 | * | 5/2001 | Hardikar et al. | 716/1 |
| 6,274,394 B1 | * | 8/2001 | Cha | 438/14 |
| 6,289,257 B1 | * | 9/2001 | Sekine | 700/121 |
| 6,349,240 B2 | * | 2/2002 | Ogawa et al. | 700/121 |
| 6,367,040 B1 | * | 4/2002 | Ott et al. | 714/724 |
| 6,389,323 B1 | * | 5/2002 | Yang et al. | 700/110 |
| 6,408,219 B2 | * | 6/2002 | Lamey, Jr. et al. | 700/110 |
| 6,446,021 B1 | * | 9/2002 | Schaeffer | 702/118 |

OTHER PUBLICATIONS

Sapozihnikova, E, Aug. 31–Sep. 1, 1999, Knowledge–Based Intelligent Information Engineering Systems Third International Conference, pp. 361–364.*

* cited by examiner

*Primary Examiner*—John Barlow
*Assistant Examiner*—Demetrius Pretlow

(57) ABSTRACT

A method for classifying patterns of failcodes on a semiconductor wafer, in accordance with the present invention, includes determining failcodes for chips on the wafer and checking adjacent chips for each chip on the wafer having a failcode to determine a failcode pattern having a defined number of chips.

15 Claims, 4 Drawing Sheets

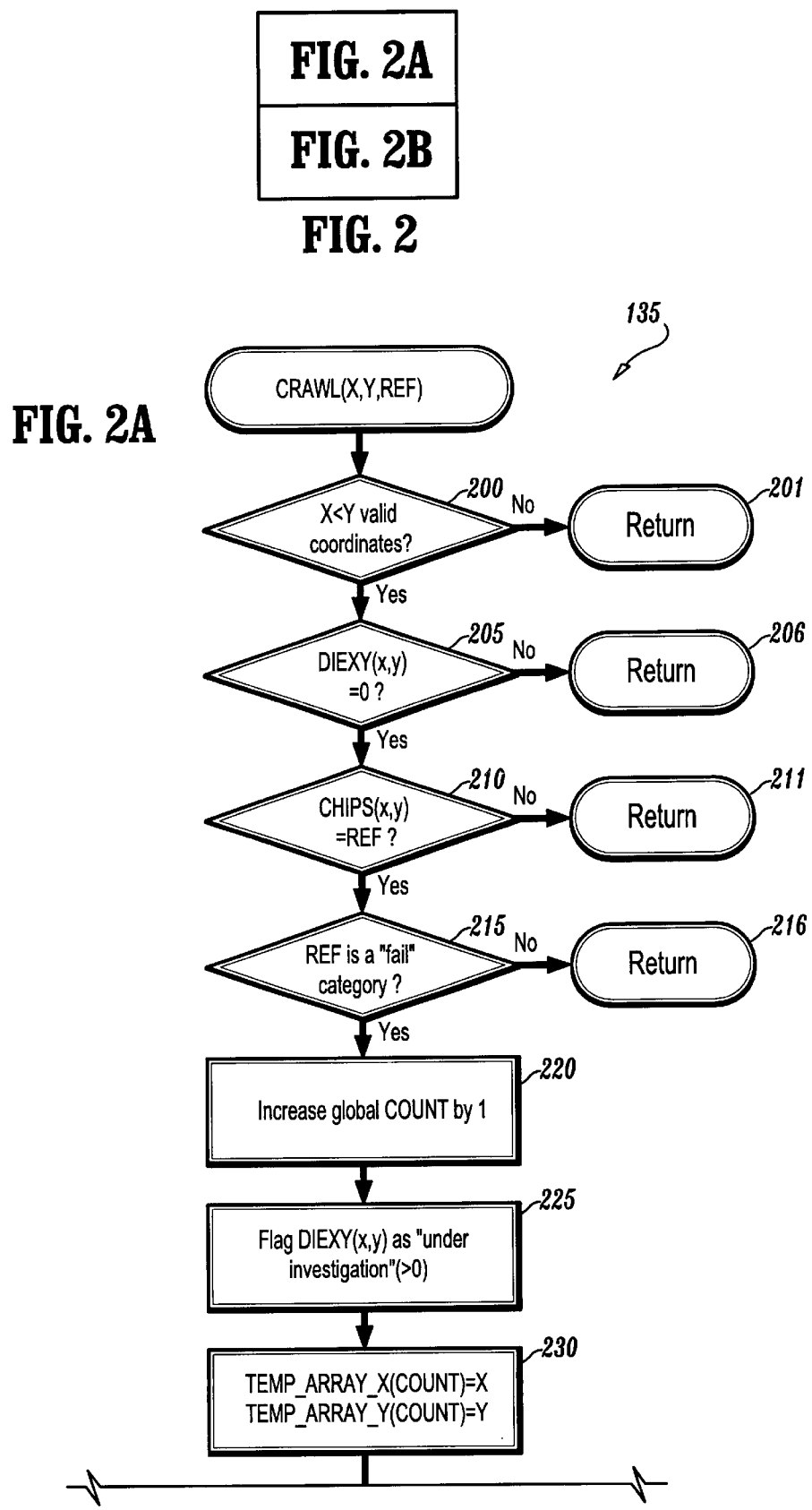

METHOD AND APPARATUS FOR FAST AUTOMATED FAILURE CLASSIFICATION FOR SEMICONDUCTOR WAFERS

BACKGROUND OF THE INVENTION

1. Field of the Invention

The present invention relates to semiconductor wafer testing, and more particularly to a recursive method for classification of wafers.

2. Description of Prior Art

Reliability and quality are at the core of the semiconductor chip industry. To ensure that these characteristics exist in the large number of chips produced, a method is needed to classify chips quickly and accurately. Classification is used to recognize failures and to implement the appropriate corrective procedures to prevent the reoccurrence of those failures.

Typically, the evaluation of wafer test results needs a significant amount of engineering work, especially in high-volume production sites. Manual tasks performed by trained engineers include, for example, estimation, trending and pareto diagnostics. Automated classification of failure patterns on the wafers can release those resources (engineers). Further, the results of manual diagnostics are subject to bias associated with an individual engineer's judgment. An automated method could eliminate such bias.

Ongoing development of neural networks, as a method to characterize failure mechanisms, is computationally expensive and is not available to semiconductor chip manufacturers at this time.

Therefore, a need exists for a method and apparatus for detecting failure patterns on semiconductor wafers, while providing accurate figures related to the detection of failure patterns, for example, related yield loss, and also generating yield loss pareto charts with improved accuracy.

SUMMARY OF THE INVENTION

The present invention relates to a method for classifying patterns of failcodes on a semiconductor wafer. The method determines for each chip a failcode, if one exists at all. The method also checks adjacent chips for each chip on the wafer having a failcode to determine a failcode pattern having a defined number of chips.

A method for classifying patterns of failcodes on a semiconductor wafer, in accordance with the present invention, includes determining failcodes for chips on the wafer and checking adjacent chips for each chip on the wafer having a failcode to determine a failcode pattern having a defined number of chips.

Another method for classifying patterns of failcodes on a semiconductor wafer, in accordance with the present invention, includes providing failure information from a wafer tester, determining failcodes for chips on the wafer by employing the failure information, checking adjacent chips for each chip on the wafer to determine if the adjacent chips have a same failcode and determining a pattern of chips having the same failcode upon tracking a defined number of chips.

In other methods, the step of checking adjacent chips may further include the steps of determining once for each chip having a failcode adjacent chips having the same failcode, tracking adjacent chips having the same failcode, and determining a pattern of chips having the same failcode upon tracking a defined number of adjacent chips having the same failcode. The defined number of adjacent chips having the same failcode may be determined in accordance with a cluster size, which serves as a threshold for recognition of a pattern. The cluster size is preferably adjustable to provide a sensitivity for pattern detection. The method may include the step of outputting the failcode pattern to analyze the wafer. The step of checking adjacent chips for each chip on the wafer may include flagging each chip as a good chip, part of a detected pattern or under investigation.

A computer program product of the present invention includes a computer usable medium having computer readable program code embodied therein for a recursive classification of semiconductor wafers. The computer readable program code in the computer program product includes computer readable program code for causing a computer to determine whether a chip on the wafer is a pass or a failcode, computer readable program code for causing the computer to determine a characteristic failcode for each chip having a failcode, computer readable program code for causing the computer to add a first chip to a temporary array, if the first chip is a failcode and computer readable program code for causing the computer to determine adjacent chips having the same failcode as the first chip. A computer readable program code is also included for causing the computer to add an adjacent second chip having the same failcode to the temporary array, and a computer readable program code is included for causing the computer to classify the temporary array of chips having the same failcode as a pattern upon identifying at least a predefined number of chips in the temporary array.

These and other objects, features, and advantages of the present invention will become apparent from the following detailed description of illustrative embodiments thereof, which is to be used in connection with the accompanying drawings.

BRIEF DESCRIPTION OF THE DRAWINGS

Preferred embodiments of the present invention will be described below in more detail, with reference to the accompanying drawings:

FIG. 2a is a block diagram showing a portion of the system and method of the recursive CRAWL procedure according to one embodiment of the present invention;

DETAILED DESCRIPTION OF PREFERRED EMBODIMENT

In the semiconductor industry, wafers are tested after leaving the fabrication line, producing information regarding each chip. The information typically indicates whether each chip has passed all the tests required for fulfilling particular product specifications, or which test(s) have been failed. This information, together with the physical location (coordinates), are typically used to produce wafer maps that indicate to the responsive engineers where each kind of failure mechanism, if any, is located. For example, wafer maps may show the engineers that a certain failure mechanism occurs only on the wafer edge, or on the left-hand side of the wafer and so on. It may also show that only every other or every third wafer is affected with a particular pattern, thereby providing important hints for tracing the root cause of a failure mechanism.

According to an embodiment of the present invention, based on the data provided by the wafer tests, a list of text output is produced for each failure pattern found on each wafer. This text output describes, for example, the location, size, and failure mode of each pattern, including the actual yield loss due to that pattern. For wafers with no detectable pattern, no such output is produced. Therefore, with respect to wafers exhibiting failure mechanisms, this information can be used for at least the following:

(a) identifying the wafers that have the most severe failure patterns (sort list by yield impact);
(b) identifying the patterns that have the most severe yield impact (subtotal yield impact by pattern); and
(c) automatic disposition of wafers.

This information may also be employed for other engineering purposes, to determine failure modes, equipment problems, etc.

Figure 1:
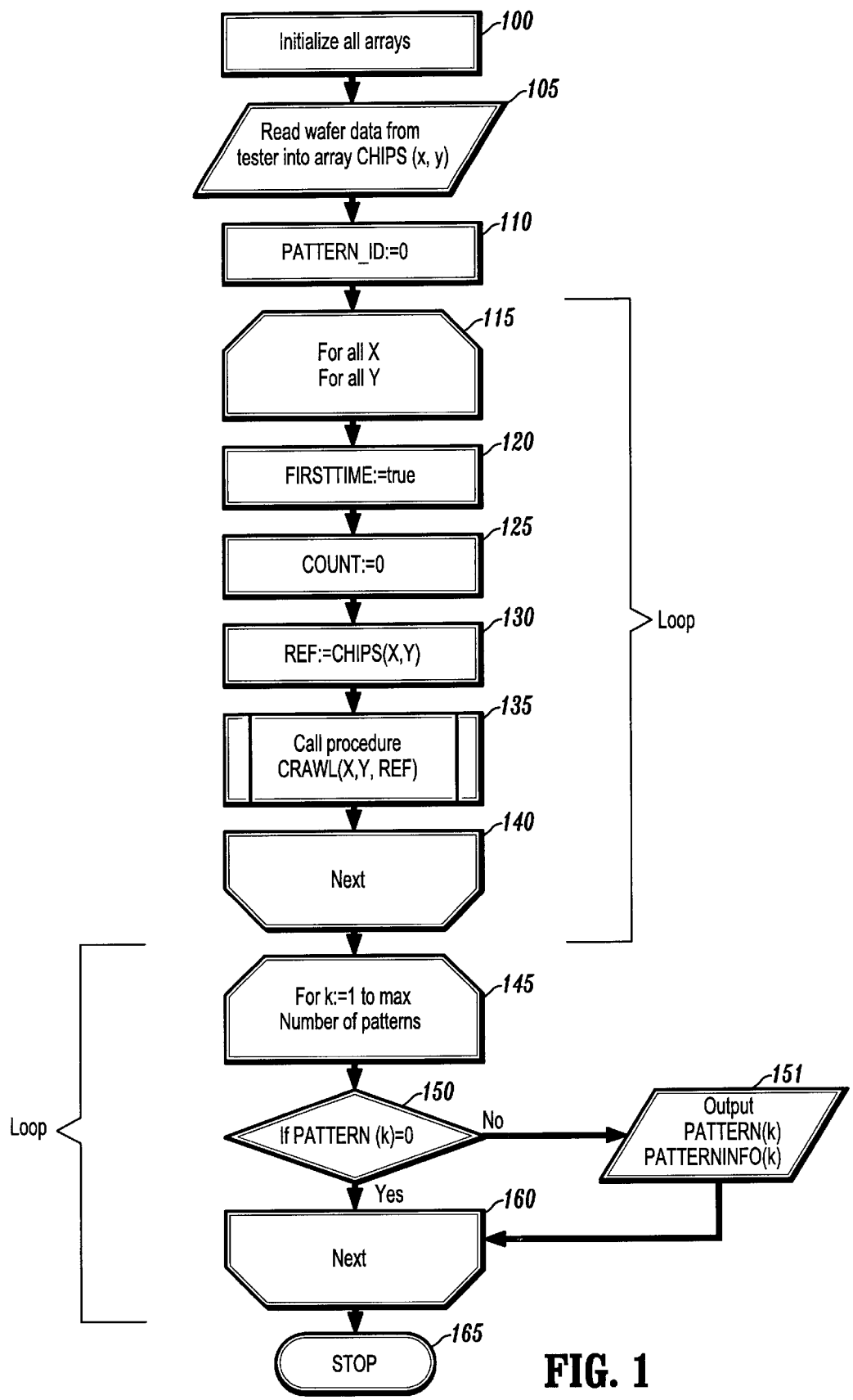
FIG. 1 is a block diagram showing a system and method for calling a CRAWL procedure according to one embodiment of the present invention.

In one embodiment of the present invention, the method includes a main procedure depicted in FIG. 1, which initializes used variables and calls a recursive procedure for each chip. The procedure, called CRAWL, determines which adjacent chips have the same or similar failure mechanisms to the chip calling the procedure, resulting in a list of adjacent chips having the same or similar failure mechanism.

The results of the CRAWL procedure can be used to determine corrective measures. This may reduce the time needed to discover failure mechanisms and implement corrective changes in the manufacture process by limiting time consuming procedures such as individual diagnosis performed by engineers. The recursive CRAWL procedure is discussed in more detail with respect to FIGS. 2a and 2b.

It is to be understood that the elements shown in the Figs. may be implemented in hardware, software or a combination thereof. Referring now to the figures in which like numbers show the same or similar elements, with respect to FIG. 1, in one embodiment of the present invention, the method initializes several global arrays of variables 100. These may include CHIPS and DIEXY, which are two-dimensional arrays corresponding to actual (x,y) coordinates of chips (and dies) on a wafer.

CHIPS is employed to store a code for the test results of each chip (e.g., pass or type of failure), DIEXY is used to mark patterns that are already detected or currently under investigation (see below). For example, with respect to FIG. 3, a diagram of a semiconductor wafer 300 having forty chips, seven of which are failures (e.g., 320, 340, 330) in a coordinate system of five columns and eight rows wherein chip 310 has the coordinate location (5,8). For purposes of FIG. 3, all failing chips have the same failcode for simplicity.

PATTERN and PATTERNINFO are one-dimensional arrays that store the failure code (PATTERN) and additional information (PATTERNINFO) like size and location of each detected pattern. There are two one-dimensional arrays called TEMP_ARRAY_X and TEMP _ARRAY_Y, which have indices from one to the number of chips on the wafer, which are used to temporarily store the coordinates of dies of the pattern under investigation, as long as minimum cluster size is not reached.

The method reads the pass/failcode information from the tester into the CHIPS array 105. In another embodiment, the method can classify or transform the codes from the tester, such that they well-defined codes are stored in CHIPS array. Further, the method can combine several different tester codes into one more general code for the CHIPS array, this may be needed, for example, when the classifications from the tester are very specific, and chips failing from one physical root cause may have slightly different electrical classifications.

According to an embodiment of the present invention, after a global index variable PATTERN_ID is set to zero 110, the main loop of the program goes over each die coordinate 115. The main loop sets the global variables FIRSTTIME to true in block 120 and COUNT to zero in block 125, each time before calling the procedure CRAWL 135 for each of the die coordinates with the correspondent pass/failcode information from the CHIPS array in block 130. CRAWL 135 is the recursive code of the method disclosed in this disclosure. CRAWL procedure called in block 135 will, once called with the pass/fail code information for a given chip, call itself a plurality of time (in this example, 8 times) with the coordinates of each adjacent chip and compare the pass/fail code information of those adjacent chips with the pass/fail code information with the calling procedure. If there is no chip with the same failcode among the adjacent eight chips, the CRAWL 135 procedure terminates.

For each adjacent chip, however, that has the same failcode as that provided to the calling procedure, the procedure calls itself recursively, now investigating the eight adjacent chips of that chip. Continuous patterns are successively identified by CRAWL procedure in block 135, as will be explained in greater detail below.

After this loop is completed, the information stored in the PATTERN and PATTERNINFO arrays is written to an output file 151, and ready for use for other data analysis or by different wafer classification software 160.

Figure 2B:
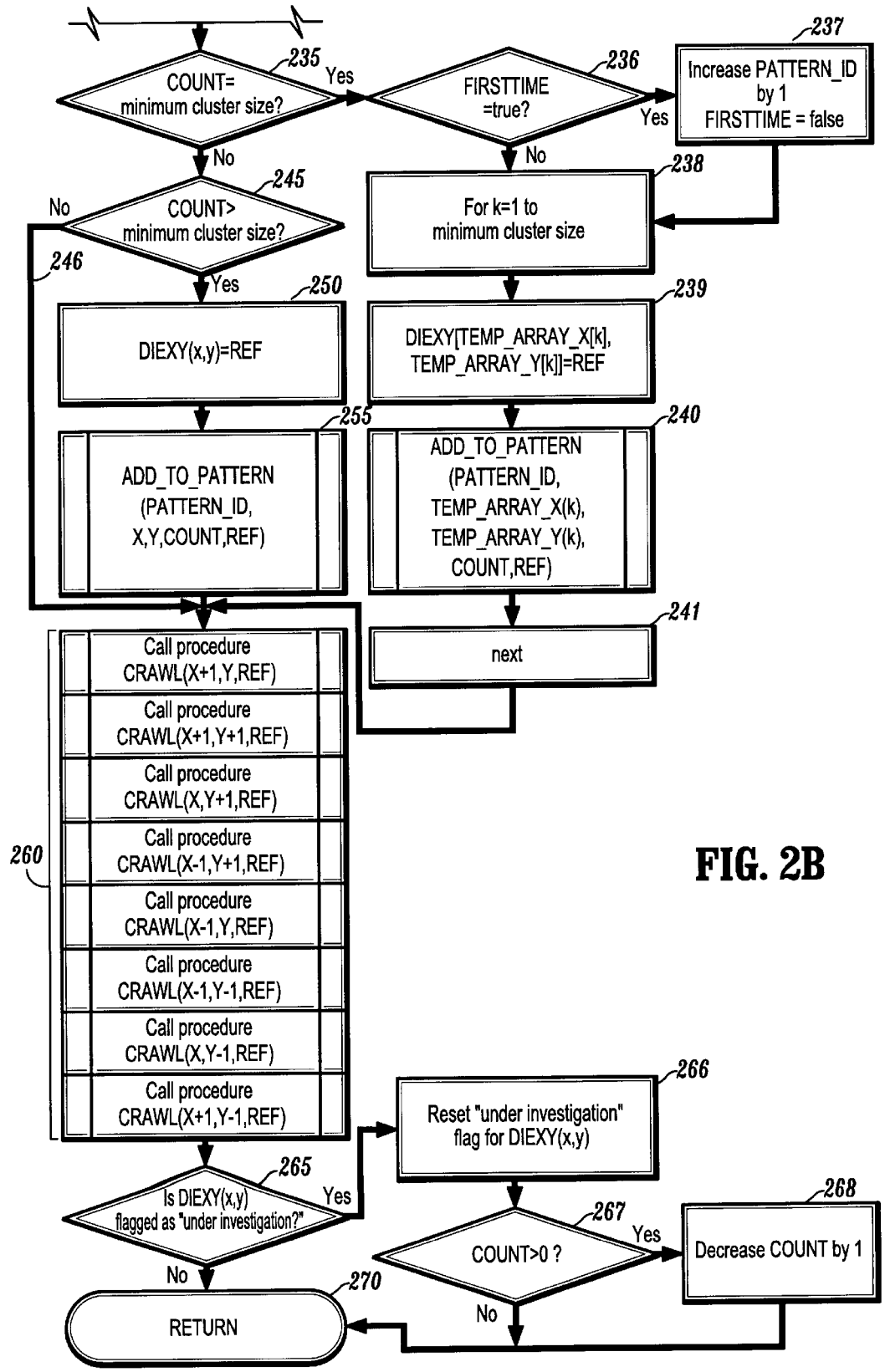
FIG. 2b is a block diagram showing a portion of the system and method of the recursive CRAWL procedure according to one embodiment of the present invention.

With respect to FIGS. 2a and 2b, CRAWL 135 determines whether the x and y coordinates are valid 200 (inside the boundaries of the wafer). Because of the recursive nature of the procedure, CRAWL 135 may call itself with non-valid coordinates.

The CRAWL procedure also checks the DIEXY array for the die in question 205, the DIEXY array is a global array used to mark patterns that are already detected or currently under investigation. It is assumed that DIEXY includes zero for chips that are not yet classified and are not currently looked at by one of the calling CRAWL procedures 260. If DIEXY includes a value other than zero, the chip has either been classified (attributed to another pattern), or is one of the adjacent die being evaluated by one of the calling CRAWL procedures 260. If DIEXY includes a value other than zero the procedure terminates and the program flow returns in block 206, to the calling procedure 135.

The method determines whether the chip at the current (x,y) coordinates has the same pass or failcode as the one from the calling procedure 210. For example, with respect to FIG. 3, if chip 320 initiates the calling procedure 135, investigating the surrounding eight chips, the method will determine that chip 340 is not yet classified and that it is a failure with the same failcode. Thus the method determines whether there are chips in a contiguous pattern, that is, a pattern of adjacent chips having the same failcode.

The method also determines whether a chip under investigation is a "pass" chip 215, and if it is, the method will return in block 216, to the calling procedure 135. The procedure thereby avoids classifying areas of good chips as a pattern on the wafer. The method increases the COUNT variable by one in block 220, therefore keeping track of the number of chips that belong to a specific pattern. In the example, the method will track chips 320, 340, and the group extending from chip 330. The next step is to flag the chip that is evaluated by the procedure in the DIEXY array 225, the flag will prevent subsequent evaluation by the CRAWL procedure.

The method defines a "minimum cluster size." The minimum cluster size serves as a threshold for recognition of a pattern. The threshold is a variable that determines the sensitivity of the method. For example, a procedure wherein the minimum cluster size is defined as five chips is more sensitive than a procedure in which seven chips is defined as the minimum cluster size.

As long as the minimum cluster size is not reached, the potential pattern remains undefined (the failing chips or coordinates will be counted towards a pattern until the threshold is obtained). The method, however, stores the coordinates of all dies under investigation in the arrays TEMP_ARRAY_X and TEMP_ARRAY_Y 230. Upon determining that the minimum cluster size has been met in block 235, indicated by the variable COUNT being equal to the minimum cluster size, the method determines whether this equality occurs the first time in block 236. If so, the PATTERN_ID is increased by one (meaning a new pattern is detected) and the FIRSTTIME flag is set to false in block 237. For example, with reference to FIG. 3 and a defined minimum cluster size of four chips, adjacent failures will not be classified as a pattern until a fourth failing chip is discovered in a group, for instance, until the fourth chip extending from chip 330 is discovered.

According to an embodiment of the present invention, there are two branches in the flow chart. The left branch includes blocks 250–255, and is for the case that the number of chips is already greater than the minimum cluster size. Therefore, the chip will be added to the already established pattern in blocks 250–255. The right branch includes blocks 236–241, and does substantially the same as the left branch, but where the pattern is determined to be new in block 237, the method loops through all previously stored chips, so that these chips which have so far only been tentatively stored, become part of the pattern in block 240. In both branches the chip is marked in the DIEXY array with its failcode determined in blocks 239 or 250, thus overriding the "under investigation" flag, and indicating that the chip now belongs to a pattern. The call of a procedure is employed which is called "ADD_TO_PATTERN" in blocks 240 or 255. This procedure stores information like the failcode and pattern size (maximum of COUNT) in the PATTERN and PATTERNINFO arrays, using the PATTERN_ID variable as index for these arrays, and can be used to save information like minimum and maximum x and y coordinates of the pattern, therefore indicating the pattern extension and location for further applications.

Figure 3:
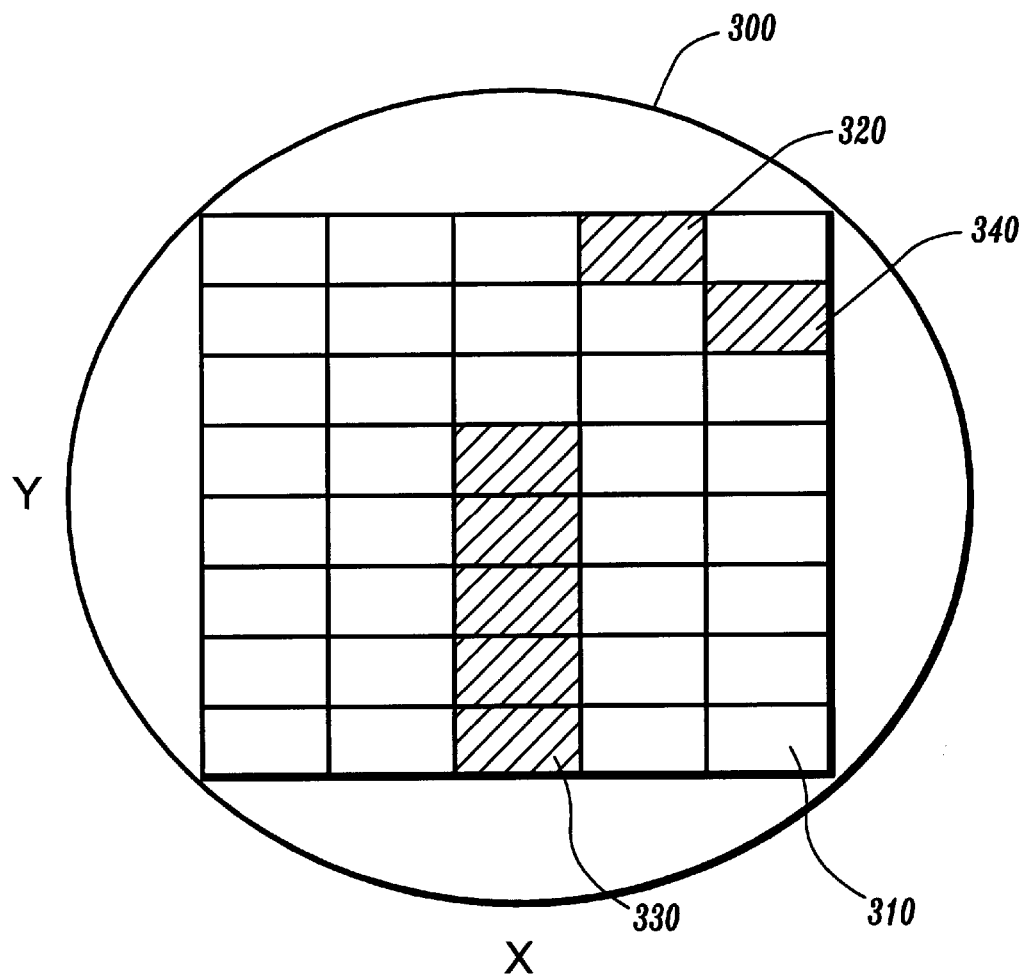
FIG. 3 is a view of a semiconductor wafer showing several failure mechanisms for chips formed on the wafer according to one embodiment of the present invention.

In case the minimum cluster size is not yet reached, both branches are skipped 246 and the procure flow continues with the recursive calls of the CRAWL procedure, for example, for all eight neighboring chips or coordinates in block 260 (See e.g., FIG. 3).

Once the CRAWL procedure flow returns from all these calls, the method determines whether the current chip is still flagged "under investigation" (e.g., not yet assigned to a pattern) in block 265. If so, the flag will be removed in block 266. If the COUNT variable is still positive in block 267, it will be decreased by one in block 268, thus marking the exit in block 270 out of one recursion layer.

The method disclosed herein can be implemented in a variety of programming languages, for example, C, C++, Fortran, etc. which are expandable producing a text file with all the failure codes found one each wafer. This file can be used, for example, for automatically classifying and dispositioning wafers, for import in a lot database, and for obtaining summarized yield reports with accurate figures. For example, if one is interested in the total yield impact of a certain failure mechanism during a particular week, the results can be worked into a spreadsheet operation on a summary file which adds all the pattern sizes of a particular failure mode, and calculates the yield loss. Since the present invention uses the ADD_TO_PATTERN procedure to also store the coordinate information for chips in a pattern, e.g., left or right side of the wafer, notch or anti-notch side, ring locations, etc. may be presented. Advantageously, the method can determine whether fails of a particular kind are concentrated in one region or another. The present invention can also supply answers to questions like "what is the [accurate] yield of impact of these type X failures on the upper right hand side of the wafers in the recent weak?"

Referring to FIG. 3, the following is an illustrative example of a preferred embodiment of the present invention. The method reads the wafer data from a tester, the data corresponding to the present wafer. In this example, semiconductor wafer 300 includes forty chips, five columns and eight rows. Each chip is assigned a coordinate location, for example, chip 310 is assigned the coordinates (5,8), denoting its location at the fifth column and the eighth row. This coordinate data is stored in the array CHIPS(x,y) 105.

The global index variable PATTERN_ID is set to zero 110, the main loop of the program goes over each of the die coordinate 115, forty in all. This loop sets the global variables FIRSTTIME to true 120 and COUNT to zero 125, each time before calling the procedure CRAWL for each of the die coordinates with the correspondent pass/failcode information from the CHIPS array 130. At this point CRAWL 135, the recursive code, is called.

CRAWL 135 determines whether the x and y coordinates are valid 200 (inside the boundaries of the wafer 300). Because of the recursive nature of the procedure, CRAWL 135 may call itself with non-valid coordinates. It also checks the DIEXY array for the die in question 205. The DIEXY array contains 0 for chips that, so far, count not be assigned to any pattern, and the REF value (assumed to be non-zero) for chips having been identified to belong to a specific pattern. This clause assures that a chip is not assigned to more than one pattern.

If DIEXY includes a value other than zero, the chip has either been classified (attributed to another pattern), or is one of the die that is evaluated by one of the calling CRAWL procedures, therefore the procedure terminates and the program flow returns 206 to the calling procedure 135. The method determines whether the chip at the current (x,y) coordinates, has the same pass or failcode 210 as the chip from the calling procedure 135. For example, with respect to FIG. 3, if chip 320 initiates the calling procedure 135, investigating the surrounding eight chips, the method will determine that chip 340 also includes a failure with the same failcode. Therefore the procedure determines whether there are chips in a contiguous pattern.

The method also determines whether the chip is a "pass" chip 215, and if it is, the method will return 216 to the calling procedure 135. Thereby the procedure avoids classifying areas of good chips as a pattern on the wafer. The method increases the COUNT variable by one in block 220, therefore keeping track of the number of chips that belong to a specific pattern. In this example, the method will track chips 320, 340, and the group extending from chip 330. The next step is to flag the chip that is evaluated by the procedure in the DIEXY array 225, the flag will prevent subsequent evaluation by CRAWL procedure.

The method defines a "minimum cluster size." The minimum cluster size serves as a threshold for recognition of a pattern. For purpose of the example, assume the minimum cluster size is four. This threshold sets the sensitivity of the method. The method stores the coordinates of all dies under investigation in the TEMP_ARRAY_X and TEMP_ARRAY_Y arrays 230. In the example chips 320 and 340 as well as the group extending from chip 330 will be stored in this way. Upon determining that the minimum cluster size has been met 235, indicated by the variable COUNT being equal to the minimum cluster size, the method determines whether this equality occurs the first time 236, and if so, the PATTERN_ID is increased by one (meaning a new pattern detected) and the FIRSTTIME flag is set to false 237. With reference to FIG. 3, and the minimum cluster size of four chips, the string of failures will not be classified as a pattern until the fourth failing chip is discovered in the group extending from chip 330. Therefore the group including chips 320 and 340 will not be classified as a pattern, while the group extending from chip 330 will be classified as a group once the fourth chip in the group is identified 237, looping through the other three identified chips, including them in the pattern. The Fifth chip will be added to the existing pattern in blocks 250 and 255 of FIG. 2b.

Once a pattern is identified, the chips or coordinates included in the pattern are marked in the DIEXY array with the corresponding failcode in blocks 239 or 250, thus overriding the "under investigation" flag, and indicating that the chip now belongs to a pattern.

At this point "ADD_TO_PATTERN" in blocks 240 or 255 is called. This procedure stores information like the failcode and pattern size (maximum of COUNT) in the PATTERN and PATTERNINFO arrays, using the PATTERN_ID variable as index for these arrays, and can be used to save information like minimum and maximum x and y coordinates of the pattern, therefore indicating the pattern extension and location for further applications.

In case the minimum cluster size is not yet reached, for example, the group indicating chips 320 and 340, both branches are skipped 246 and the procure flow continues with the recursive calls of the CRAWL procedure for all eight neighboring chips or coordinates in block 260.

Once the CRAWL procedure flow returns from all these calls, the method determines whether the current chip is still flagged "under investigation" (not yet assigned to a pattern) 265, as chips 320 and 340 will be in a system using a minimum cluster size of four chips. The flag will be removed 266 from both chips 320 and 340, and if the COUNT variable is still positive 267, it will be decreased by one 268, thus marking the exit 270 out of one recursion layer.

After this loop is completed, the information stored in the PATTERN and PATTERNINFO arrays is written to an output file 151, and ready for use by for other data analysis or wafer classification software 160.

Having described preferred embodiments of a method for characterizing failure mechanisms and detecting failure patterns on semiconductor wafers, it is noted that modifications and variations can be made by persons skilled in the art in light of the above teachings. It is therefore to be understood that changes may be made in the particular embodiments of the invention disclosed which are within the scope and spirit of the invention as defined by the appended claims.

What is claimed is:

1. A method for classifying patterns of failcodes on a semiconductor wafer, comprising the steps of:
   determining failcodes for chips on the wafer;
   checking adjacent chips for each chip on the wafer having a failcode to determine a failcode pattern having a defined number of chips, wherein the step of checking comprises determining once for each chip having a failcode, adjacent chips having the same failcode, tracking adjacent chips having the same failcode, and determining a pattern of chips having the same failcode upon tracking a defined number of adjacent chips having the same failcode; and
   outputting the failcode pattern to analyze the wafer.

2. The method of claim 1, wherein the defined number of adjacent chips having the same failcode is determined in accordance with a cluster size, which serves as a threshold for recognition of a pattern.

3. The method of claim 2, wherein cluster size is adjustable to provide a sensitivity for pattern detection.

4. The method of claim 1, wherein the step of checking adjacent chips for each chip on the wafer includes flagging each chip as a good chip, part of a detected pattern or under investigation.

5. A method for classifying patterns of failcodes on a semiconductor wafer, comprising steps of:
   providing failure information from a wafer tester;
   determining failcodes for chips on the water by employing the failure information,
   checking adjacent chips for each chip on the wafer to determine if the adjacent chips have a same failcode;
   determining a pattern of chips having the same failcode upon tracking a defined number of chips; and
   outputting the failcode pattern to analyze the wafer.

6. The method of claim 5, wherein the step of checking adjacent chips further comprises the steps of:
   determining once for each chip having a failcode adjacent chips having the same failcode.

7. The method of claim 5, wherein the step of checking adjacent chips includes tracking adjacent chips having the same failcode until a determination of a pattern is made.

8. The method of claim 5, wherein the defined number of chips is determined in accordance with a cluster size, which serves as a threshold for recognition of a pattern.

9. The method of claim 8, wherein cluster size is adjustable to provide a sensitivity for pattern detection.

10. The method of claim 5, wherein the step of checking adjacent chips includes flagging each chip as a good chip, part of a detected pattern or under investigation.

11. A program storage device readable by machine, tangibly embodying a program of instructions executable by the machine to perform method steps for classifying patterns of failcodes on a semiconductor wafer, the method steps comprising:
   determining failcodes for chips on the wafer;
   checking adjacent chips for each chip on the wafer having a failcode to determine a failcode pattern having a defined number of chips, wherein the step of checking comprises determining once for each chip having a failcode, adjacent chips having the same failcode, tracking adjacent chips having the same failcode, and determining a pattern of chips having the same failcode upon tracking a defined number of adjacent chips having the same failcode; and
   outputting the failcode pattern to analyze the wafer.

12. The program storage device of claim 11, wherein the defined number of adjacent chips having the same failcode is determined in accordance with a cluster size, which serves as a threshold for recognition of a pattern.

13. The program storage device of claim 12, wherein cluster size is adjustable to provide a sensitivity for pattern detection.

14. The program storage device of claim 11, wherein the step of checking adjacent chips for each chip on the wafer includes flagging each chip as a good chip, part of a detected pattern or under investigation.

15. A computer program product comprising a computer usable medium having a computer readable program code embodied therein for a recursive classification of semiconductor wafers, the computer readable program code in the computer program product comprising:

computer readable program code for causing a computer to determine whether a chip on the wafer has a pass or a failcode;

computer readable program code for causing the computer to determine a characteristic failcode for each chip having a failcode;

computer readable program code for causing the computer to add a first chip to a temporary array, if the first chip has a failcode, computer readable program code for causing the computer to determine adjacent chips having the same failcode as the first chip;

computer readable program code for causing the computer to add an adjacent second chip having the same failcode to the temporary array; and computer readable program code for causing the computer to classify the temporary array of chips having the same failcode as a pattern upon identifying at least a predefined number of chips in the temporary array.

* * * * *